United States Patent
Lu

(10) Patent No.: US 11,489,004 B2
(45) Date of Patent: Nov. 1, 2022

(54) DISPLAY SUBSTRATE, METHOD FOR MANUFACTURING SAME, AND DISPLAY DEVICE THEREOF

(71) Applicant: Shenzhen China Star Optoelectronics Semiconductor Display Technology Co., Ltd., Shenzhen (CN)

(72) Inventor: Macai Lu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 147 days.

(21) Appl. No.: 16/620,542

(22) PCT Filed: Nov. 4, 2019

(86) PCT No.: PCT/CN2019/115334
§ 371 (c)(1),
(2) Date: Dec. 9, 2019

(87) PCT Pub. No.: WO2020/258634
PCT Pub. Date: Dec. 30, 2020

(65) Prior Publication Data
US 2021/0343781 A1    Nov. 4, 2021

(30) Foreign Application Priority Data
Jun. 28, 2019 (CN) .......................... 201910571150.0

(51) Int. Cl.
*H01L 27/15* (2006.01)
*H01L 33/00* (2010.01)
*H01L 33/62* (2010.01)

(52) U.S. Cl.
CPC .......... *H01L 27/156* (2013.01); *H01L 33/005* (2013.01); *H01L 33/62* (2013.01)

(58) Field of Classification Search
CPC combination set(s) only.
See application file for complete search history.

(56) References Cited

U.S. PATENT DOCUMENTS

2005/0151469 A1*  7/2005  Tachikawa .......... H01L 51/0003
                                                  313/506
2017/0104009 A1*  4/2017  Peng .................... H01L 27/1259
(Continued)

FOREIGN PATENT DOCUMENTS

CN          106571371           4/2017
CN          108682312           10/2018
(Continued)

*Primary Examiner* — Ratisha Mehta

(57) ABSTRACT

A display substrate is provided. The display substrate includes a substrate layer. A functional layer is disposed on the substrate layer, and a first positioning layer is disposed on the functional layer. A constituent material of the first positioning layer includes a magnetic material. The provided display substrate utilizes a novel magnetic positioning function layer structure, so that it can self-align with the other functional layer structure disposed on the magnetic positioning layer structure, thereby improving an alignment precision between the two structures, and reducing a repair cost which may be caused due to insufficient alignment precision. At the same time, a self-alignment process also simplifies the corresponding alignment operation.

2 Claims, 2 Drawing Sheets

(56) References Cited

U.S. PATENT DOCUMENTS

2018/0301265 A1   10/2018  Wu et al.
2019/0067367 A1*  2/2019  Sejima .................. H01L 27/105
2021/0028225 A1*  1/2021  Zhang ................. H01L 33/0095

FOREIGN PATENT DOCUMENTS

| CN | 109003966 | 12/2018 |
| CN | 110335874 | 10/2019 |

* cited by examiner

DISPLAY SUBSTRATE, METHOD FOR MANUFACTURING SAME, AND DISPLAY DEVICE THEREOF

RELATED APPLICATIONS

This application is a National Phase of PCT Patent Application No. PCT/CN2019/115334 having International filing date of Nov. 4, 2019, which claims the benefit of priority of Chinese Patent Application No. 201910571150.0 filed on Jun. 28, 2019. The contents of the above applications are all incorporated by reference as if fully set forth herein in their entirety.

FIELD AND BACKGROUND OF THE INVENTION

This disclosure relates to touch display technology, and more particularly, to a display substrate, a method for manufacturing the display substrate, and a display device including the display substrate.

It is known that with continuous development of flat display technology, various types of flat panel displays have been developed in the conventional technology, and LED-based displays have been greatly developed. In addition to organic light emitting diode (OLED) displays, micro light emitting diode displays (micro-LED displays) have been developed.

The display principle of the micro-LED display is to thin, miniaturize, and array a structure design of LEDs, and a size thereof is only about 1-10 μm. Then, the LEDs are transferred to a circuit substrate (including electrodes and the transistors) in a batch manner. An upper protective layer and an upper electrode are deposited by a physical deposition process, and finally an upper substrate is packaged. Thus, a simple structure of the micro LED display completes assembly.

However, as described above, in order to manufacture the micro-LED display, it is necessary to transfer tiny LEDs from an original substrate onto a receiving substrate and arrange them in an array. This operation involves a precise transfer process of a huge amount of tiny micro-LED devices, and a subsequent precise bonding process is also a problem.

At present, in an electrode bonding process between the micro-LED and thin film transistor (TFT), a conventional method is that the micro-LED is first transferred to the receiving substrate, and then transferred to a predetermined position through the receiving substrate. The electrode bonding process is performed with pre-patterned binding materials on a display substrate. Specifically, low-melting metals such as AuSn, InSn, etc., are used for binding when the process is performed. Since the process involves a solid-liquid-solid phase conversion between the binding materials, that makes the process complicate. At the same time, it is tend to cause poor binding, and which leads to an increase in the cost of subsequent repairs.

Therefore, it is necessary to provide a novel display substrate to overcome the drawbacks of the conventional technology.

SUMMARY OF THE INVENTION

The object of this disclosure is to provide a display substrate comprising such that it can perform self-alignment operation with other magnetic positioning functional layer structures disposed thereon, thereby improving an alignment precision between the two structures, and reducing a repair cost which may be caused due to insufficient alignment precision. At the same time, a self-alignment operation also simplifies the corresponding alignment operation.

In order to solve the above-mentioned drawbacks, the technical solutions provided by the disclosure are as follows.

This disclosure provides a display substrate. The display substrate comprises a substrate layer. A functional layer is disposed on the substrate layer, and a first positioning layer is disposed on the functional layer. A constituent material of the first positioning layer comprises a magnetic material.

Moreover, in different embodiments, the magnetic material of the first positioning layer comprises at least one of a ferromagnetic material, a cobalt magnetic material, and a nickel magnetic material. For example, the magnetic materials comprises, but not limited to, such as NiFe, CoFe, and FeCrCo.

Moreover, in different embodiments, the first positioning layer may be a single layer structure or a multilayer structure composed of different magnetic materials. For example, it may be a two-layered laminated structure, or may be a three or more layers laminated structure. Specifically, the laminated structure can be determined, but is not limited to, according to requirements.

Moreover, in different embodiments, the functional layer comprises a TFT device layer, a passivation layer (PV layer) is disposed on the TFT device layer, and the first positioning layer is disposed on the passivation layer. In other embodiments, the first positioning layer may be disposed on a planar layer (OC layer) or an insulating layer, etc. Specifically, the configuration can be determined, but is not limited to, according to requirements.

Moreover, in different embodiments, a micro-LED is disposed on the first positioning layer, a second positioning layer is corresponding disposed on the micro-LED, the second positioning layer is made of a magnetic material, and the first positioning layer and the second positioning layer are connected by magnetic positioning.

Moreover, in different embodiments, barrier layers (bank) are disposed on the functional layer corresponding to both sides of the first positioning layer.

Moreover, in different embodiments, a pixel defining layer and a top electrode layer are further disposed on the functional layer, and an electrode layer of the micro-LED is electrically connected to the top electrode layer.

Moreover, in different embodiments, a material of the pixel defining layer is a material having an undercut (under cut) structure.

In addition, another object of this disclosure is to provide a method for manufacturing a display substrate of the disclosure. The method comprises:

a step S1 of providing a substrate layer, and forming a functional layer on the substrate layer; and a step S2 of depositing a magnetic material on the functional layer through a deposition process to form a first positioning layer.

Moreover, in different embodiments, in the step S2, the first positioning layer is subjected a magnetization process after the first positioning layer is formed.

Moreover, in different embodiments, the method further comprises a step S3 of forming barrier layers (bank) on the functional layer corresponding to both sides of the first positioning layer.

Moreover, in different embodiments, the method further comprises a step S4 of deposing a buffer between the two barrier layers, and then deposing a predetermined micro-LED into the buffer between the two barrier layers, wherein the micro-LED comprises a second positioning layer, the second positioning layer is made of a magnetic material. As the buffer is gradually volatilized, self-aligned positioning of the micro-LED on the first positioning layer is proceeded by a magnetic connection between the first positioning layer and the second positioning layer.

Moreover, in different embodiments, the method further comprises a step S5 of forming a pixel defining layer and a top electrode layer on the functional layer and the micro-LED correspondingly.

Moreover, in different embodiments, in the step S5 when the pixel defining layer is formed on the substrate, a material of the pixel defining layer is a material having an undercut (under cut) structure. Besides, the formation of the pixel defining layer is such that upon deposition of the subsequent top electrode, the transparent conductive layer (TCO) will self-align to form a plurality of mutually insulating regions (forming insulating isolation lines).

Moreover, in different embodiments, in the step S5, the top electrode layer is formed by an Open Mask deposition process. The top electrode layer may be a transparent conductive material (TCO), such as ITO, IZO, AZO, or a metal material. Due to the undercut structure on the micro LED and the TFT substrate, the electrode wires and the wires are insulated from each other.

In addition, another object of this disclosure is to provide a display device, which comprises the display substrate of this disclosure.

Advantageous effects of the disclosure are as follows. The disclosure relates to a display substrate, which comprises a novel magnetic positioning layer. Preliminary automatic positioning and fixing is achieved by mutual attraction between magnetic positioning layers, and is applied to a micro LED, thereby effectively improving an alignment precision between the micro LED and a TFT electrode on display substrate in a transfer process and improving the binding yield.

Furthermore, in the method for manufacturing the display substrate of the disclosure, the material of forming the pixel defining layer is a material having an undercut (under cut) structure. The undercut structure of the pixel defining layer enables that mutually independent electrodes can be formed subsequently through the undercut structure after depositing the top electrode layer, and it is not necessary to apply a precise metal mask (Fine Metal Mask) deposition technology. The transparent conductive material (TCO) used in the self-alignment forms a plurality of mutually insulated regions, and further forms insulating isolation lines.

The top electrode layer is deposited by an Open Mask process to form a self-aligned conductive connection layer. An electrode connection of all the micro LEDs to the TFTs on the display substrate can be completed at one time, and the connection between each of the micro LEDs and the TFT electrodes on the display substrate does not cause a difference, thereby effectively improving the fabrication yield of the device.

BRIEF DESCRIPTION OF THE SEVERAL VIEWS OF THE DRAWINGS

In order to more clearly illustrate the embodiments of the disclosure or the technical solutions in the prior art, the following briefly introduces the accompanying drawings used in the embodiments. Obviously, the drawings in the following description merely show some of the embodiments of the disclosure. As regards one of ordinary skill in the art, other drawings can be obtained in accordance with these accompanying drawings without making creative efforts.

DETAILED DESCRIPTION OF PREFERRED SPECIFIC EMBODIMENTS OF THE INVENTION

Figure 1:
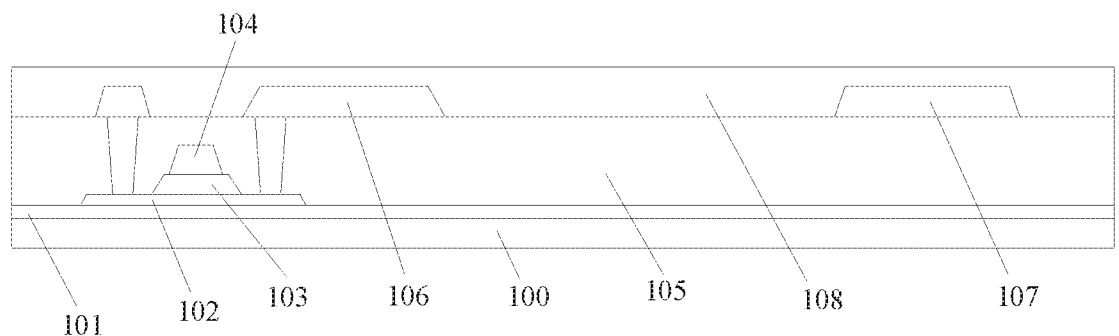
FIG. 1 is a schematic structural diagram of a display substrate manufactured by a method according to an embodiment of the disclosure after a step S1 is completed.

In order to more clearly describe the embodiments relating to a display substrate, a method for manufacturing the display substrate of the disclosure, and a display device including the display substrate, the description is used to make a simple introduction of the drawings used in the following embodiments.

Since the disclosure relates to a structure of a display substrate and a method for manufacturing the display substrate, in order to avoid unnecessary description, the structure of the display substrate according to the disclosure will be described below in combination with the method for manufacturing the display substrate.

One embodiment of the disclosure provides a method for manufacturing a display substrate. The method comprises the following steps.

In a step S1, a substrate layer 100 is provided. A functional layer is formed on the substrate layer.

The functional layer includes a TFT device functional layer. Specifically, a buffer layer (buffer layer) 101 is deposited on a glass substrate layer or other substrate layer 100. The buffer layer 101 may be a single layer or a stacked structure. Specifically, a material of the buffer layer may be SiOx, SiNx/SiOx, AlOx/SiOx, and the like. Then, an IGZO or similar oxide semiconductor film layer 102, for example, IZO, IGO, IGTO, IGZTO, and the like, is deposited on the buffer layer 101 and patterned.

Then, a gate insulating layer (GI) 103 and a gate electrode (GE) layer 104 are deposited and patterned. The gate insulating layer 103 may also be a single layer or a stacked structure. Specifically a material of the gate insulating layer may be SiOx, SiNx, AlOx, SiNx/SiOx, and the like. The gate electrode layer 104 is preferably a Cu/Mo layer, a Cu/MoTi layer, a Cu/Ti layer, an Al/Mo layer, and a single layer of CuNb alloy and so on.

An interlayer dielectric layer (ILD layer) 105 is then deposited, and the interlayer dielectric layer is performed a patterned process and an apertured process. The ILD layer 105 can be a SiOx layer, SiOx/SiNx stacked layer, and the like. A source/drain (S/D) metal electrode layer 106 is deposited and patterned. The patterned process of the source/drain metal electrode layer also forms a Vss access terminal metal layer 107. However, the metal layer 107 is merely illustrative. The functional layer may include, but is not limited to, different functional metal layers. The S/D layer 106 is preferably a Cu/Mo layer, a Cu/MoTi layer, a Cu/Ti layer, an Al/Mo layer, and a CuNb alloy single layer.

Finally, a passivation layer (PV) 108 is deposited. The passivation layer 108 may be a single layer or a stacked structure, and a material of the passivation layer may be SiNx, SiOx, SiOx/SiOx, and the like. The structure of the passivation layer is shown in FIG. 1.

Further, the TFT device layer included in the functional layer and the passivation layer disposed thereon are merely exemplified, and in other different embodiments, the functional layer may be composed of, but is not limited to, other device layers according to requirements.

In a step S2, a magnetic material is deposited on the functional layer through a deposition process to form a first positioning layer 110.

Figure 2:
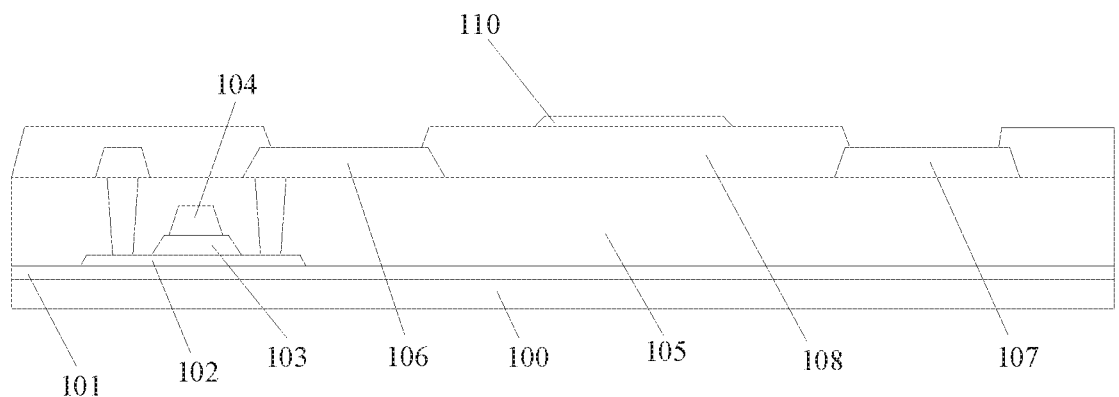
FIG. 2 is a schematic structural diagram of the display substrate manufactured by a method according to FIG. 1 of the disclosure after a step S2 is completed.

The first positioning layer 110 may be a single layer or a laminated structure, and a material of the first positioning layer may be one or more of NiFe, CoFe, and FeCrCo. Further, after the first positioning layer 110 is disposed, the first positioning layer is also magnetized. Referring to FIG. 2, a schematic structural diagram of the display substrate is shown.

Figure 3:
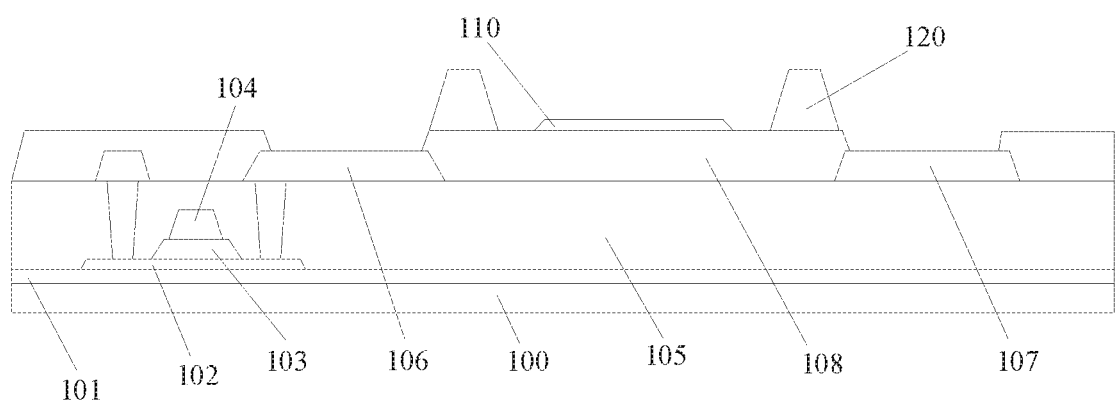
FIG. 3 is a schematic structural diagram of the display substrate manufactured by a method according to FIG. 1 of the disclosure after a step S3 is completed.

In a step S3, barrier layers (banks) 120 are formed on the functional layer corresponding to both sides of the first positioning layer 110. Referring to FIG. 3, a schematic structural diagram of the display substrate is shown.

Figure 4:
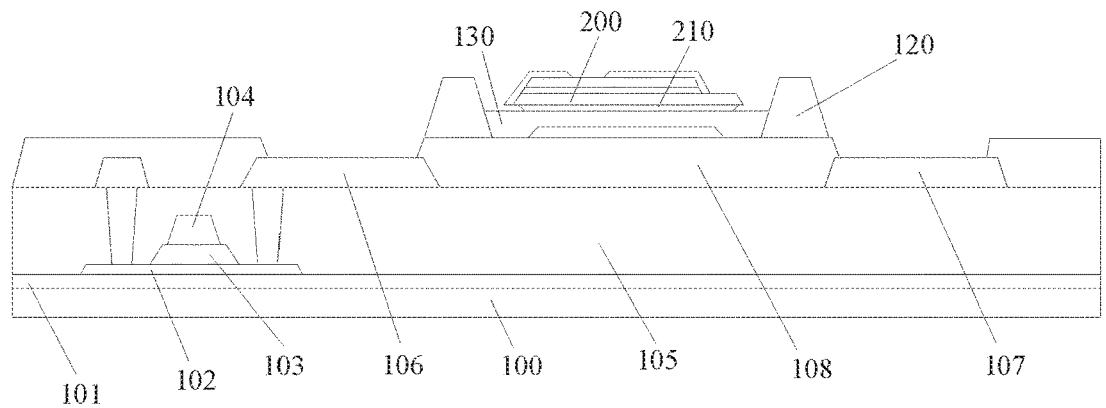
FIG. 4 is a schematic structural diagram of the display substrate manufactured by a method according to FIG. 1 of the disclosure after a first stage of a step S4 is completed.

In a step S4, a buffer 130 is deposed between the two barrier layers 120, and then a predetermined micro-LED 200 is deposed into the buffer between the two barrier layers 130. The micro-LED comprises a second positioning layer 210, the second positioning layer is made of a magnetic material. Referring to FIG. 4, a schematic structural diagram of the display substrate is shown.

The micro-LED 200 enters a region of the barrier layer 120 of the display substrate by LASER or by other massive transfer methods. Under the action of the buffer 130, the micro-LED 200 is preliminarily fixed on the display substrate by the self-alignment of a magnetic field of the first positioning layer 110 and a magnetic field of the second positioning layer 210 of a bottom portion thereof.

Figure 5:
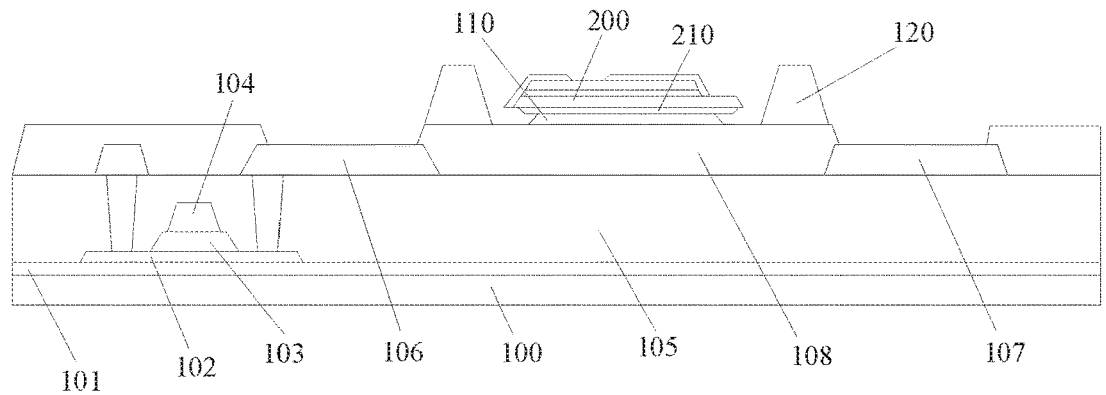
FIG. 5 is a schematic structural diagram of the display substrate manufactured by a method according to FIG. 4 of the disclosure after a second stage of a step S4 is completed.

Furthermore, as the buffer 130 is gradually volatilized, self-aligned positioning of the micro-LED 200 on the first positioning layer 110 is proceeded by a magnetic connection between the first positioning layer 110 and the second positioning layer 120. Referring to FIG. 5, a schematic structural diagram of the display substrate is shown.

Figure 6:
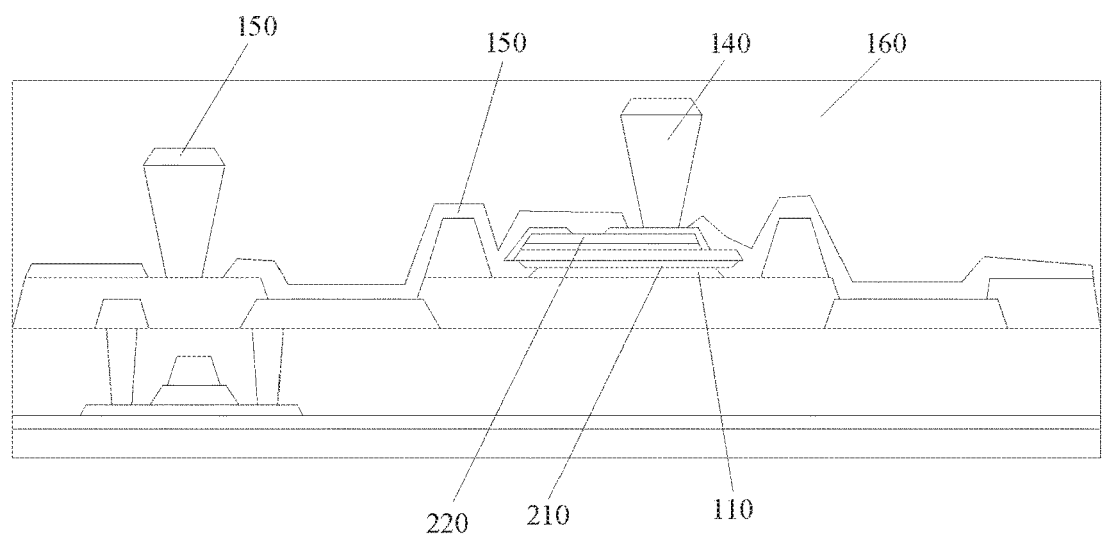
FIG. 6 is a schematic structural diagram of the display substrate manufactured by a method according to FIG. 1 of the disclosure after a step S5 is completed.

In a step S5, a pixel defining layer 140 and a top electrode layer 150 are formed on the functional layer and the micro-LED 200 correspondingly. Finally, an encapsulation layer 160 is formed. An electrode layer 220 of the micro-LED 200 and the top electrode Layer 150 is electrically connected. Referring to FIG. 6, a schematic structural diagram of the display substrate is shown. The structure shown in FIG. 6 is also a complete structural diagram of the display substrate according to the disclosure.

Specifically, in the step S5, in different embodiments, when the pixel defining layer 140 is formed on the substrate, a material of the pixel defining layer is a material having an undercut (under cut) structure. The undercut structure of the pixel defining layer enables that mutually independent electrodes can be formed subsequently through the undercut structure after depositing the top electrode layer, and it is not necessary to apply a precise metal mask (Fine Metal Mask) deposition technology. The transparent conductive material (TCO) used in the self-alignment forms a plurality of mutually insulated regions, and further forms insulating isolation lines.

Moreover, the top electrode layer is formed by an Open Mask deposition process. The top electrode layer 150 may be a transparent conductive material (TCO) such as ITO, IZO, or AZO, or a metal material, and electrode wires and wires are insulated from each other by the micro LED 200 and the undercut structure on the display substrate.

In addition, another object of this disclosure is to provide a display device, which comprises the display substrate of this disclosure.

The top electrode layer is deposited by an Open Mask process to form a self-aligned conductive connection layer. An electrode connection of all the micro LEDs to the TFTs on the display substrate can be completed at one time, and the connection between each of the micro LEDs and the TFT electrodes on the display substrate does not cause a difference, thereby effectively improving the fabrication yield of the device.

This disclosure has been described with preferred embodiments thereof, and it is understood that many changes and modifications to the described embodiment can be carried out without departing from the scope and the spirit of the invention that is intended to be limited only by the appended claims.

What is claimed is:

1. A method for manufacturing a display substrate, comprising:
    a step S1 of providing a substrate layer, and forming a functional layer on the substrate layer; and
    a step S2 of depositing a magnetic material on the functional layer through a deposition process to form a first positioning layer;
    a step S3 of forming barrier layers on the functional layer corresponding to both sides of the first positioning layer, wherein the barrier layers are adjacent to the first positioning layer; and
    a step S4 of deposing a buffer between two barrier layers, and then deposing a predetermined micro-LED into the buffer between the two barrier layers, wherein the micro-LED comprises a second positioning layer, the second positioning layer is made of a magnetic material, wherein as the buffer is gradually volatilized, self-aligned positioning of the micro-LED on the first positioning layer is proceeded by a magnetic connection between the first positioning layer and the second positioning layer.

2. The method according to claim 1, wherein in the step S2, the first positioning layer is subjected a magnetization process after the first positioning layer is formed.

* * * * *